United States Patent [19]

Greaves et al.

[11] 4,315,229
[45] Feb. 9, 1982

[54] BANDSTOP FILTERS

[75] Inventors: Alan J. Greaves, Ipswich; Philip E. Greenaway; Charles Nightingale, both of Felixstowe, all of England

[73] Assignee: The Post Office, London, England

[21] Appl. No.: 125,049

[22] Filed: Feb. 27, 1980

[30] Foreign Application Priority Data

Mar. 2, 1979 [GB] United Kingdom ............... 07375/79

[51] Int. Cl.³ .................... H03H 11/04; H03H 7/075
[52] U.S. Cl. .................................. 333/216; 328/167; 333/217
[58] Field of Search .................. 333/216, 217; 328/167

[56] References Cited

U.S. PATENT DOCUMENTS

| | | | |
|---|---|---|---|
| 3,594,650 | 7/1971 | Henoch | 333/216 X |
| 3,750,037 | 7/1973 | Schmidt | 333/217 X |
| 3,886,469 | 5/1975 | Rollett et al. | 328/167 X |
| 4,147,997 | 4/1979 | Greaves | 333/216 X |
| 4,208,641 | 6/1980 | Suzuki | 333/217 |

*Primary Examiner*—Paul L. Gensler
*Attorney, Agent, or Firm*—Larry S. Nixon

[57] ABSTRACT

A filter network that exhibits a bandstop response comprises a network of basically low pass or high pass structure. The network is developed by choosing a bandstop transfer function, a fourth-orderelliptic is disclosed, which is converted to a low pass function. This function describes a passive low pass LC ladder network including a negative impedance element. A Bruton transformation is applied to the passive LC network to give an active version including an ungrounded negative resistance network in a series arm and frequency-dependent negative resistances in shunt arms without requiring inductance coils for its implementation.

12 Claims, 11 Drawing Figures

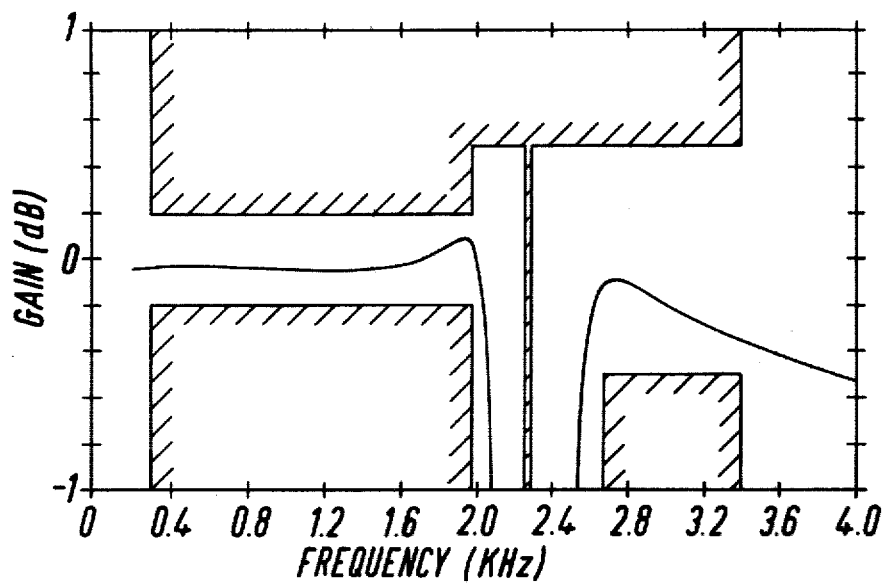
FIG. 4(a) Passband response.
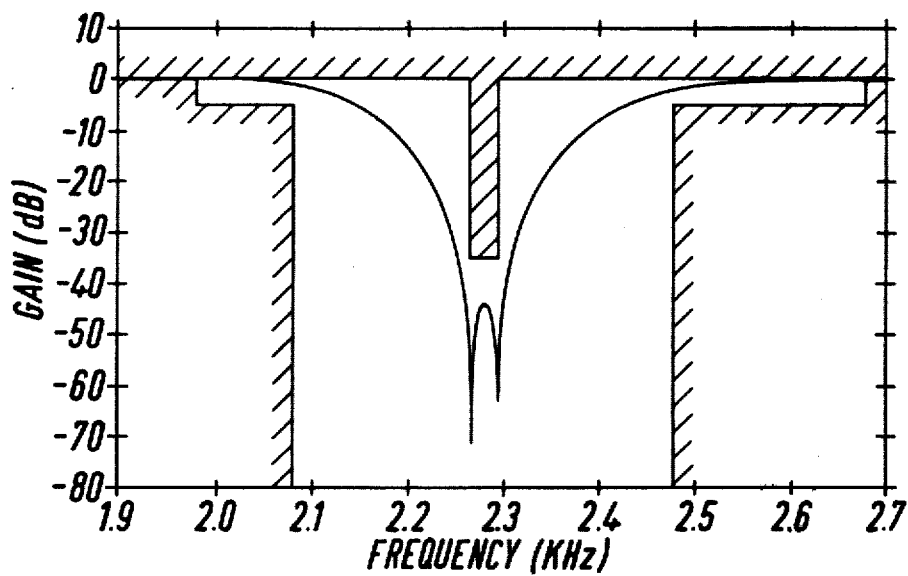
FIG. 4(b) Stopband response.

BANDSTOP FILTERS

DESCRIPTION

This invention relates to electrical filter networks that exhibit a bandstop response.

In telecommunications systems there is a demand for increasingly high performance bandstop filters to suppress signalling tones. It is well known that bandstop filters, whether passive or active, are particularly troublesome to design both with regard to economic constraints and in view of the intrinsic difficulties involved. It is important that the high performance of the filters is not achieved at the cost of high sensitivity to component variations. Furthermore, it is often desirable to use filter circuits in which the use of inductance coils can be avoided and it is now common for filter circuits to include only amplifiers, resistors and capacitors since such circuits can be small, light, can be realised in microelectronic form and can utilise thin film or thick film components.

According to the present invention, there is provided:

A low pass or high pass electrical filter network modified to include at least one negatively valued impedance element so that the network exhibits a bandstop response.

The filter network may be substantially equivalent to a passive low pass LC ladder network including at least one ungrounded negative inductance or grounded negative capacitance. Alternatively the filter network may be substantially equivalent to a passive high pass LC ladder network with at least one ungrounded negative capacitance or grounded negative inductance.

The filter network may be an active ladder network which is a Bruton transform of said passive LC ladder network, and includes an ungrounded negative resistance in a series arm and at least one frequency-dependent negative resistance in a shunt arm.

The ungrounded negative resistance may comprise two operational amplifiers, the respective output terminals of which are connected by a separate resistance element to each of the input terminals of the other amplifier, and the respective inverting input terminals of which are connected by a resistance element.

Each frequency-dependent negative resistance in a shunt arm may have an additional connection to circuit ground via a relatively large valued resistance, this resistance increasing the Q-factor of the resonance of the shunt arm to which it is connected.

The passive LC ladder network may include an inductance element in the output impedance termination shunt arm, this inductance element being transformed to a resistance in said active Bruton transform network.

The passive LC ladder network may be a 5th order network comprising first, second and third junction points, an input terminal, an output terminal, a first series arm extending between the input terminal the first junction point and comprising in parallel a first resistance element and a first inductance element and a second inductance element connected between the parallel combination and the first junction point;

a second series arm extending between the first and second junction points and comprising a third inductance element this element having a negative value;

a third series arm extending between the second and third junction points and comprising a forth inductance element, the third junction point being connected to said output terminal;

a first shunt arm connected from the first junction point to ground and comprising a fifth inductance element in series with a first capacitance element;

a second shunt arm connected from the second junction point to ground and comprising a sixth inductance element in series with a second capacitance element; and a terminating impedance arm connected from the third junction point to ground and comprising, in parallel, a seventh inductance element and a second resistance element.

An embodiment of the invention will not be described, by way of example only, with reference to the accompanying drawings. In the drawings:

FIGS. 4a and 4b are graphs of frequency response plotted against gain of the circuit of FIG. 3;

Bandstop filter circuits are usually chosen or designed in accordance with a specification setting out the performance limits that the filter is required to operate between. In describing the present embodiment of the invention the following performance specification will be assumed as an example to illustrate the construction of a practical circuit.

It is assumed that a bandstop filter is required to suppress a 2280 Hz signalling tone and that any transmission in the range 2280±15 Hz shall be reduced by at least 35 dB. Attenuation of any frequency accompanying the signalling tone is required not to exceed:

5 dB for frequencies above 2480 Hz and below 2080 Hz, and 0.5 dB for frequencies above 2680 Hz and below 1880 Hz.

In addition, the maximum gain distortion in the rage 500–1980 Hz is required to be less than 0.4 dB.

It will be appreciated by those familiar with these types of electrical networks that this specification is very demanding and not easily met by conventional bandstop filters.

Figure 1:
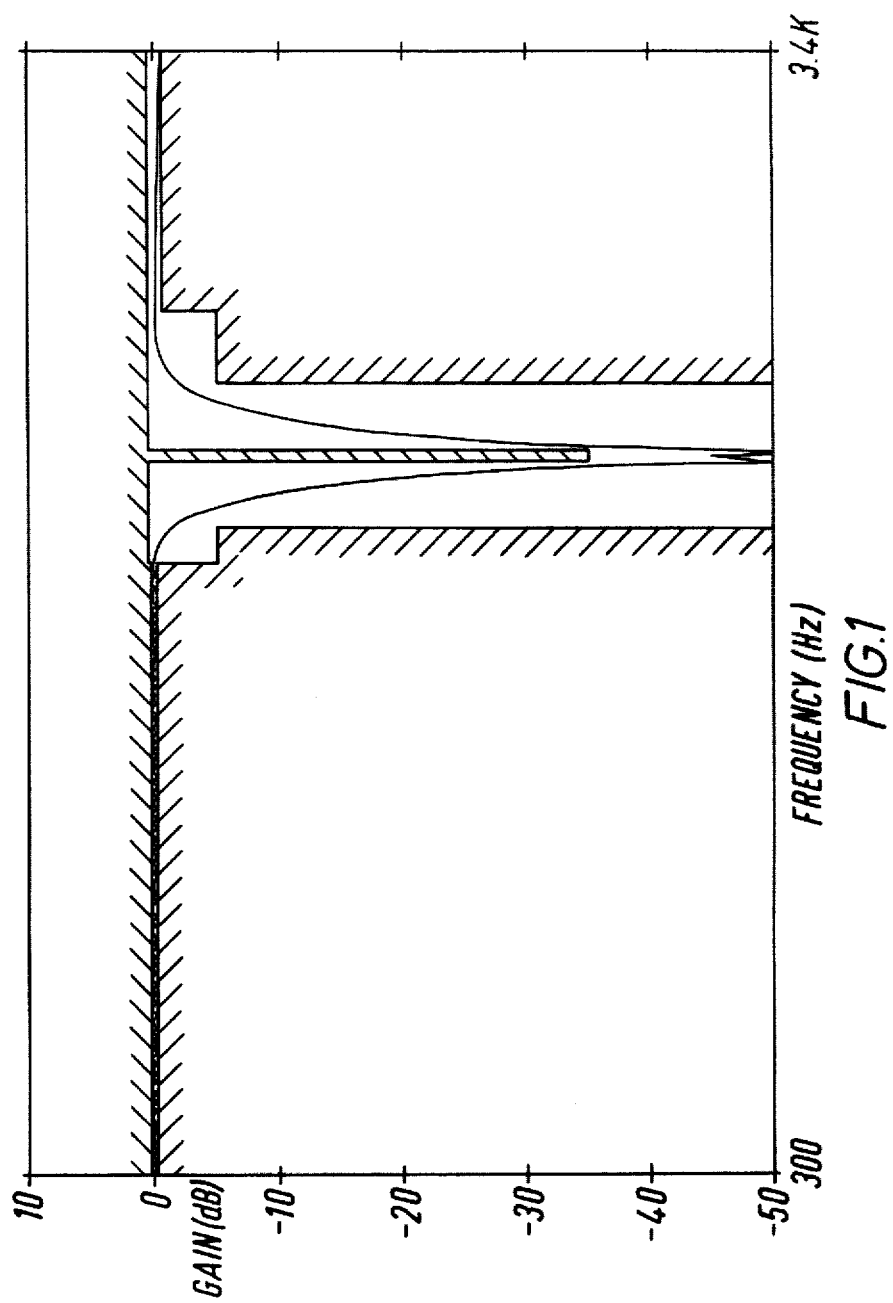
FIG. 1 is a graph of frequency response plotted against gain for a fourth-order elliptic bandstop transfer function indicating allowed variation limits.

A bandstop transfer function is chosen to meet the requirements of the specification, and in the present embodiment a fourth-order elliptic transfer function is chosen which gives 0.2 dB ripple in the passband and 45 dB rejection in the stopband. The function is de-normalised to a stopband centre of 2280 Hz. FIG. 1 shows the gain/frequency characteristic of this de-normalised function and also the specification requirement illustrated as a template (shaded region).

In order to realise this transfer function as a low pass filter, it is necessary to convert this transfer function to a low pass function. The low pass transfer function chosen is of the form having a numerator of order $2n$ and a denominator of order $(2n+1)$ ($n$ being an integer) and by choosing $n=2$, the fourth order bandstop function can be converted to a low pass transfer function of this form by multiplying the denominator of the bandstop function by a factor (s+k), where s is the complex frequency variable and k is a convenient constant.

By adding this extra pole to the bandstop response the gain of the filter is caused to decrease at high frequencies, as would be expected with a fundamentally low pass filter. It is therefore necessary to choose the value of the constant k high enough to prevent the response at high frequencies from failing the specification, while maintaining it sufficiently low to avoid extreme component ratios. Choosing k=5 has been found to produce a response which after de-normalisation is within the specification limits, and on the scale of FIG. 1, the response is almost indistinguishable from the bandstop response in that Figure.

If the low pass character of the network produced by the extra denominator factor (s+k)—that is the decreasing gain at high frequencies—is undesirable then the network response can readily be corrected by an additional circuit which in the frequency range of interest cancels the added factor (s+k). In this way the original bandstop transfer function can be recovered. The additional circuit may consist of extra components modifying the performance of a buffer amplifier which is often required at either or both the input or output of the network or by cascading the complete network including the buffers with another network with the desired cancelling behaviour in the frequency range of interest.

Methods are known for determining a set of component values for an impedance-terminated low pass fifth-order filter, and it has been found that the fifth-order transfer function under consideration may be realised in more than one way, but each realisation includes at least one negaive impedance element.

Figure 2:
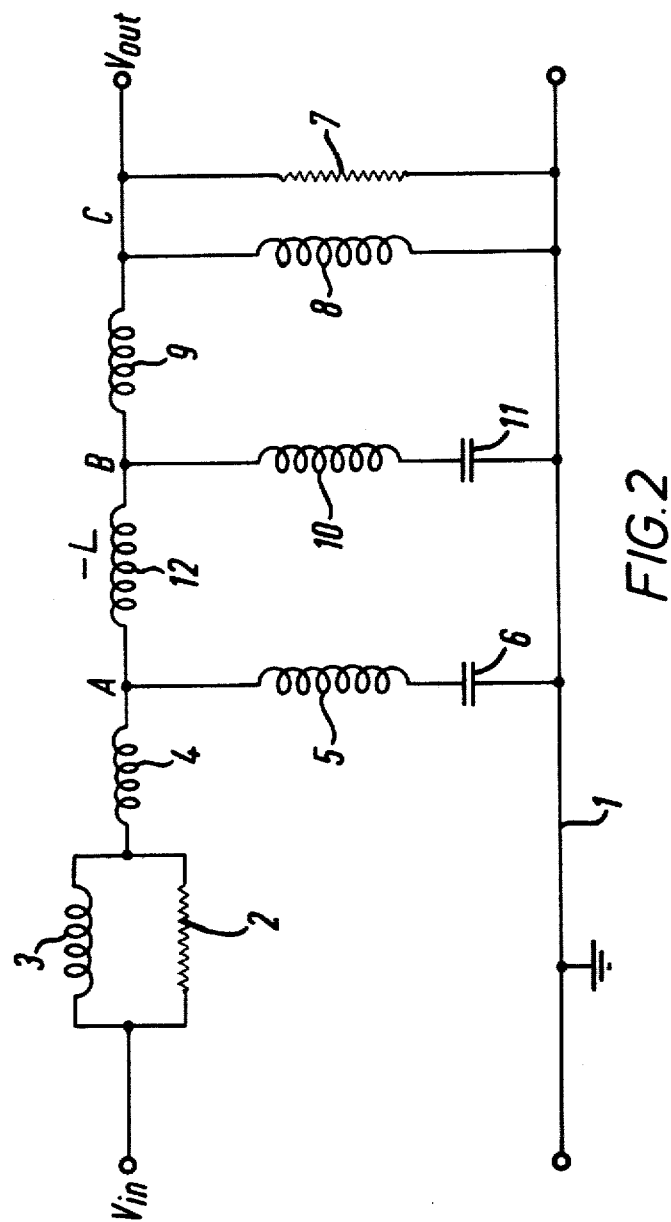
FIG. 2 is a circuit diagram of a passive prototype fifth order low pass filter modified to produce a response within the limits shown in FIG. 1.

The passive structure of the low pass LC ladder network used as a prototype is shown in FIG. 2 with one set of component values that gives the required characteristic. This set is chosen since it includes only one negative element, an ungrounded inductance, and the circuit has been found to be surprisingly insensitive to component value variations in comparison with other circuits including negative impedance elements.

Referring to FIG. 2, the passive prototype network is connected between input and output terminals $V_{in}$ and $V_{out}$ and a line 1 connected to circuit ground. The input and output terminals are connected via a number of series-connected impedance elements, and a number of junction points between the series-connected elements are connected to the circuit ground line 1 by further impedance elements. These branches connecting the series elements to ground are referred to as shunt arms of the network and those branches of the series connected line between shunting junctions or between a shunting junction and an input or output terminal are referred to as series arms.

The network comprises three series arms, two shunt arms and an impedance termination arm. The first series arm is connected between the input terminal $V_{in}$ and a first junction point A and comprises a resistance element 2 connected in parallel with an inductance element 3 and an inductance element 4 connected in series with the parallel combination 2 and 3. The first shunt arm is connected from the junction point A to the circuit ground line 1 and includes, in series, an inductance element 5 connected to point A and a capacitance element 6 connected to the line 1 (i.e. a substantially lossless resonant circuit). The impedance termination arm of the network is connected from a junction point C to the circuit ground line 1 and comprises a resistance element 7 in parallel with an inductance element 8. The junction point C is also connected to a second junction point B via the third series arm including an inductance element 9. The output terminal $V_{out}$ is connected to the junction point C. The second shunt arm of the network extends from the junction point B via an inductance element 10 and a capacitance element 11 to the ground line 1 (i.e. another substantially lossless resonant circuit).

The junction points A and B are connected by the second series arm of the network, which comprises a negative inductance element 12. The circuit components have the normalized values set out in table 1 below.

The normalized values assume a one ohm source resistance and a center frequency of one radian per second. Of course once these are modified to practical values for a particular case, then the rest of the parameter values are scaled similarly.

TABLE 1

| | | | |
|---|---|---|---|
| Resistance | 2 | 1.000 | Ω |
| " | 7 | 0.8151 | Ω |
| Inductance | 3 | 50 | H |
| " | 4 | 1.131 | H |
| " | 5 | 9.928 | H |
| " | 8 | 40.91 | H |
| " | 9 | 1.116 | H |
| " | 10 | 7.446 | H |
| " | 12 | −1.701 | H |
| Capacitance | 6 | 0.09948 | F |
| " | 11 | 0.1360 | F |

In order to construct a circuit including a negative impedance element it is necessary to include at least one active device. It is possible to construct an ungrounded negative inductance element from active elements, but it is preferable to eliminate inductances altogether and to build a negative resistance element rather than a negative inductance element, and so use is made of a theoretical circuit transformation proportional to $s^{-1}$ described by Bruton (Bruton, L.T, Proc. I.E.E.E. 56 pp 1378-9 August 1968). The voltage transfer function is invariant with respect to this transformation. This transformation converts all inductances in a network to resistances, all resistances to capacitances, and all capacitances to frequency-dependent negative resistances, FDNRs, these latter devices having impedances proportional to $s^{-2}$. Thus, after this transformation the negative inductance becomes an ungrounded negative resistance.

Figure 3:
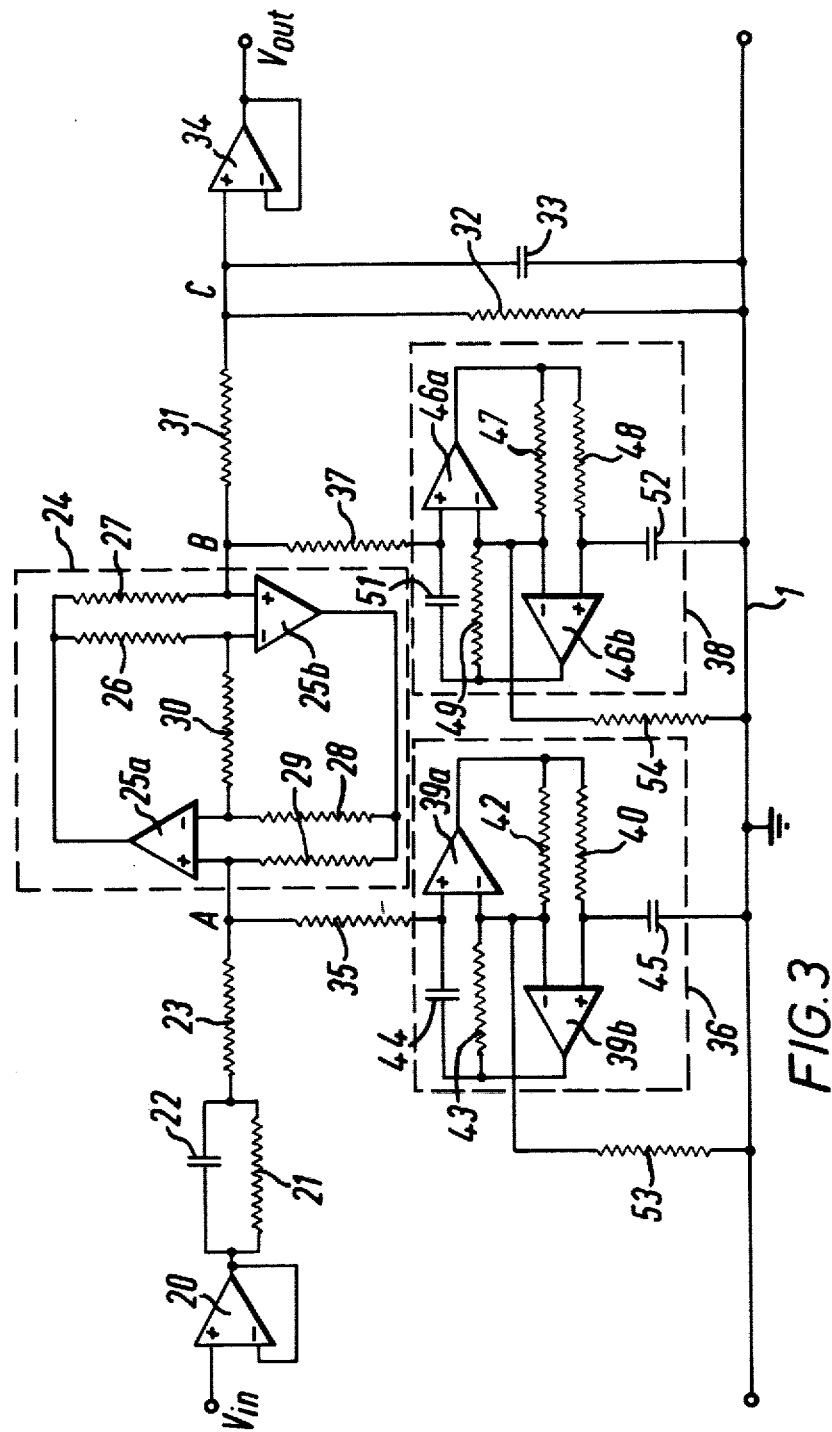
FIG. 3 is a circuit diagram of an active network that is a Bruton transform of the circuit of FIG. 2.

Referring now to FIG. 3, the circuit shown is an active implementation of the passive prototype circuit of FIG. 2 transformed by a Bruton transformation.

The network input terminal $V_{in}$ is connected to the non-inverting input terminal of a buffer amplifier 20. The first series arm of the network is connected between the output terminal of the amplifier 20 and the junction point A. The first series arm includes a resistor 21 connected in parallel with a capacitor 22, and a resistor 23 connected between the parallel combination 21, 22 and the junction point A.

The second series arm connected between the junction points A and B comprises an ungrounded negative resistance network 24. The network 24 comprises two operational amplifiers 25a and 25b. The output terminal of amplifier 25a is connected via respective paths to the inverting and non-inverting input terminals of the amplifier 25b each of these paths includes a resistor 26, 27.

Similarly, the output terminal of the amplifier 25b is connected via respective resistors 28, 29 to the inverting and non-inverting input terminals of the amplifier 25a. The inverting input terminals of the amplifiers 25a and 25b are connected by a resistor 30, the value of which is proportional to the negative value of the network 24. The network 24 is connected to the rest of the filter circuit through a connection from the non-inverting input terminal of the amplifier 25a to junction point A and a connection from the non-inverting input terminal of amplifier 25b to junction point B.

In the present embodiment the value of the resistance R provided by the network 24 is given by:

$$R = -R_{30} \frac{R_{27}}{R_{26}} = -R_{30} \frac{R_{29}}{R_{28}} \quad (1)$$

where $R_{27}$ is the value of the resistor 27, etc.

In the present embodiment $R_{27} = R_{26} = R_{28} = R_{29}$ hence $R = -R_{30}$. However equation (1) does not necessarily hold and this is further discussed below.

The junction point B is connected via the third series arm, comprising a resistor 31 to the junction point C. The impedance termination arm extends from the junction point C to the circuit ground line 1 and includes, in parallel, a resistor 32 and a capacitor 33. The junction point C is connected to the non-inverting input terminal of a buffer amplifier 34, whose output terminal is connected to the network output terminal $V_{out}$.

The first shunt arm, extending from junction point A, comprises a resistor 35 in series with a FDNR network 36. Similarly the second shunt arm extending from junction point B comprises a resistor 37 in series with a FDNR network 38. The FDNR network 36 comprises two operational amplifiers 39a and 39b. The two inverting input terminals of the amplifiers 39a and 39b are directly connected. The output terminal of amplifier 39a is connected to the non-inverting input terminal of the amplifier 39b by a resistor 40 and to the inverting input terminal of the amplifier 39b by a resistor 42. The output terminal of the operational amplifier 39b is connected to the inverting input terminal of the amplifier 39a via a resistor 43 and to the noninverting input terminal of the amplifier 39a by a capacitor 44. The non-inverting input terminal of the amplifier 39b is connected to one terminal of a capacitor 45 whose other terminal forms one terminal of the FDNR and is connected to the circuit ground line 1. The other terminal of the FDNR is provided by the non-inverting terminal of the aplifier 39a and this is connected to the resistor 35.

The FDNR network 38 has the same structure as the network 36 although the components have different values, as will be described. The elements of network 38 are operational amplifiers 46a, 46b, resistors 47, 48 and 49, and capacitors 51 and 52.

Two additional relatively high-valued resistors 53 and 54 are added to the active circuit and these are respectively connected from the junction between the inverting terminals of the amplifiers 39a and 39b in the FDNR 36 to the circuit ground line and from the junction between the inverting terminals of the amplifiers 46a and 46b in the FDNR 38 to the circuit ground line.

If a minimum amplifier unity-gain bandwidth is assumed to be 2.8 MHz, computation shows that the two transmission zeros that bracket the stopband are down in frequency by 0.6% and 0.4% respectively. The former zero is the more sensitive and to compensate for the discrepancy thus introduced the filter is corrected by denormalising the bandstop function to 2294 Hz rather than 2280 Hz, a technique familiar to those skilled in the art.

The frequency of the transmission zeros depends on the component values in the shunt arms. In the FDNR networks (e.g. 36), the transmission zero can be adjusted by adjusting any of the resistors 40, 42 and 43. In practice it is convenient to adjust the value of a resistor 40 and resistor 48 in FDNR 38. In order to achieve the required bandstop response the resonant frequency of first shunt arm is adjusted to 2294 Hz by adjusting resistor 40 and the resonant frequency of the second shunt arm is adjusted to 2266 Hz by adjusting resistor 48.

The two resistors 53 and 54 are included to ensure that the nulls in the stopband are sharply defined and to compensate for any capacitor losses or other Q-depressing effects. These resistors increase the Q factors of each resonant shunt arm. The values of the resistors 53 and 54 are not highly critical once they have been determined for a particular realisation technique and component types so that the attenuation at the resonance is not less than 50 dB.

The component values and, where appropriate, types for the circuit of FIG. 3 required to provide the required response are set out in table 2 below.

TABLE 2

| Operational amplifiers | 20 25a, 25b 39a, 39b 46a, 46b 34 | ... Raytheon type RC4156 | |
|---|---|---|---|
| Resistors | 21 | | 1600 ± 10% | kΩ |
| | 23 | | 35.6 | kΩ |
| | 26 | | 10 | kΩ |
| | 27 | | " | " |
| | 28 | | " | " |
| | 29 | | " | " |
| | 30 | | 53.6 | kΩ |
| | 31 | | 35.2 | kΩ |
| | 32 | | 1300 ± 10% | kΩ |
| | 35 | | 313 | kΩ |
| | 37 | | 235 | kΩ |
| | 40 | Trim for null at 2294Hz | 6.75 ± 21% | kΩ |
| | 42 | | 6.8 ± 5% | kΩ |
| | 43 | | 6.8 ± 5% | kΩ |
| | 47 | | 9.1 ± 5% | kΩ |
| | 48 | Trim for null at 2266Hz | 9.23 ± 21% | kΩ |
| | 49 | | 9.1 ± 5% | kΩ |
| | 53 | | 2500 ± 20% | kΩ |
| | 54 | | 2500 ± 20% | kΩ |
| Capacitors | 22 | | 2.2 | nF |
| | 33 | | 2.7 | nF |
| | 44 | | 1.5 ± 5% | nF |
| | 45 | | 1.5 ± 5% | nF |
| | 51 | | 1.5 ± 5% | nF |
| | 52 | | 1.5 ± 5% | nF |

All components have tolerance ±1% unless otherwise indicated.

In an experimental version of the circuit, the values of resistors 40 and 48 were deliberately made 30% high, and variable 50 k resistors were added in parallel with each of them, to permit tuning of the stopband nulls. The resulting frequency response of the filter is shown in FIG. 4, showing both the pass band response (FIG. 4a) and the stopband response (FIG. 4b) to be within the specification template.

Although in the embodiment described above in equation (1) has been satisfied by making $R_{26} = R_{27} = R_{28} = R_{29}$ it will be appreciated that the value of $R_{30}$ may be scaled by a factor $k_1$; then, to maintain the value $$R = -R_{30} \frac{R_{27}}{R_{26}} = -R_{30} \frac{R_{29}}{R_{28}},$$

the component ratio $$\frac{R_{27}}{R_{26}} \left( = \frac{R_{29}}{R_{28}} \right)$$

could be scaled by a factor $k_2$ where $k_2 = 1/k_1$.

Alternatively use may be made of the following principle, that is: if a network can be divided into two parts connected by a positive or negative impedance converter or inverter, then equivalent networks can be derived by changing the conversion (or inversion) factor and at the same time changing all the impedances in one or other part of the network by the same factor. The application of this principle to negative impedance converters is perhaps rare and unfamiliar but it does allow for independence in the choice of component values on either side of the converter.

In a first case where independence on either side is not rquired $R_{27}/R_{26}$ may be maintained equal to $R_{29}/R_{28}$ and both be scaled by $k_2$. All the impedances 21, 22, 23, 35, 36, 53, 31, 32, 33, 37, 38 and 54 could then be scaled by $k_2$.

In a second case, $R_{30}$ may be fixed and $R_{29}/R_{28}$ ($\neq R_{27}/R_{26}$) scaled by $k_2$ then impedances 21, 22, 23, 35, 36 and 53 could be scaled by $k_2$. Similarly, if $R_{27}/R_{26}$ ($\neq R_{29}/R_{28}$) were scaled by a factor $k_3$ then the impedances 31, 32, 33, 37, 38 and 54 could be scaled by the factor $k_3$.

In these latter cases where $R_{27}/R_{26} \neq R_{29}/R_{28}$ since the previously mentioned independent adjustment facility is provided the input and output capacitances can be given any desired value and may, with advantage, be made equal.

Similar adjustment facilities dividing the circuit in other ways may be made available by varying the resistance ratio in the FDNRs in the shunt arms.

Some other possible passive prototypes in accordance with the present invention will now be briefly described together with an example, in each case, of an active implementation.

Figure 5A:
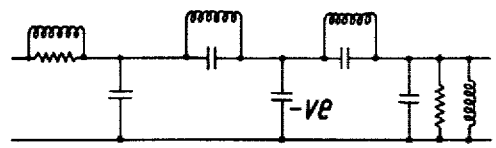
FIGS. 5a, 5b, 6a, 6b, 7a and 7b illustrate alternative passive prototypes and active implementations thereof.
Figure 5B:
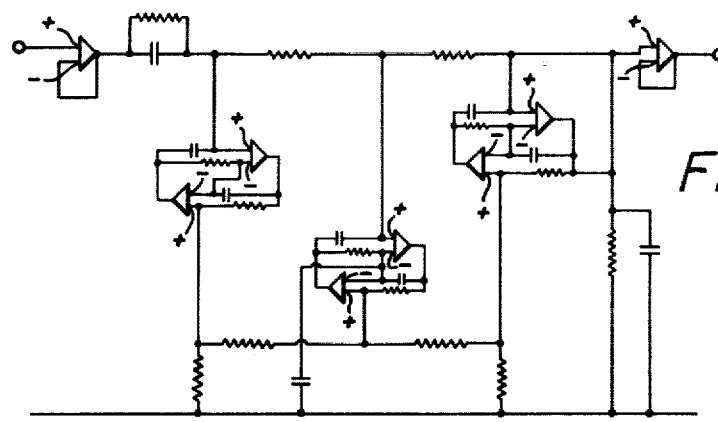

FIG. 5a shows a low pass passive prototype filter with a grounded negative capacitance and FIG. 5b shows an active transform. The three shunt arms of the prototype include capacitors the intermediate arm including a negatively valued capacitance.

Figure 6A:
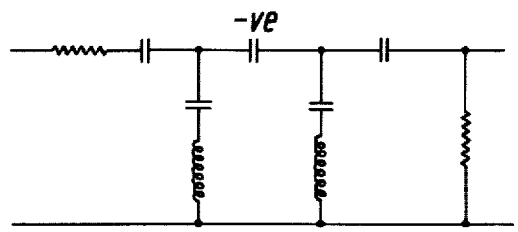
Figure 6B:
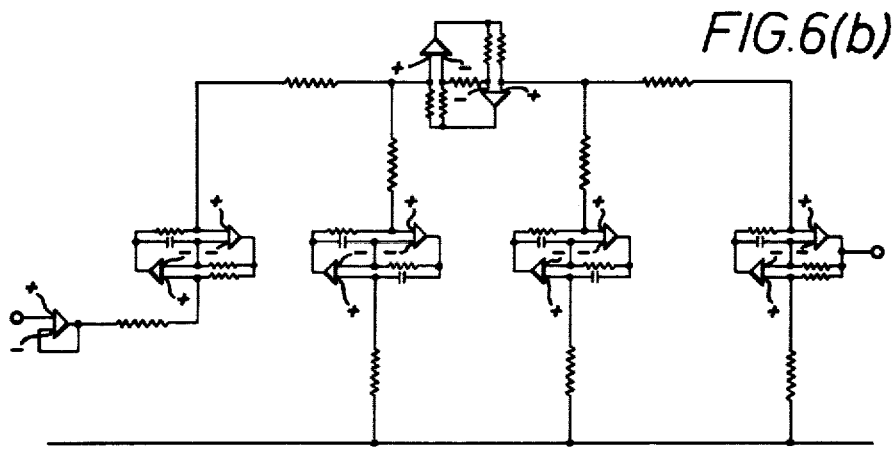

FIG. 6a shows a high pass passive prototype filter network with an ungrounded negative capacitance and FIG. 6b shows an active transform.

Figure 7A:
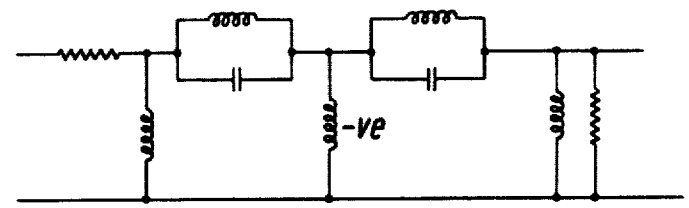
Figure 7B:
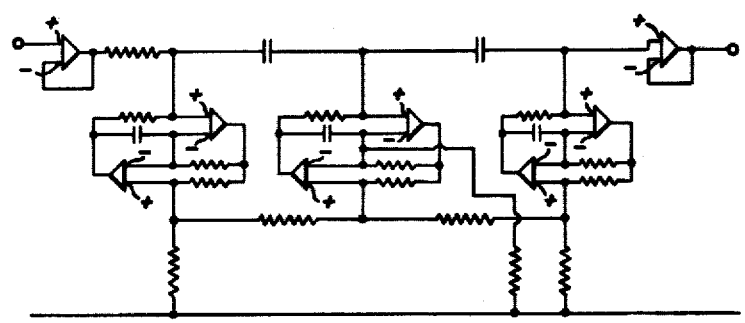

FIG. 7a shows a high pass passive prototype filter network with a grounded negative inductance and FIG. 7b shows an active transform.

It will be observed that in all the above-discussed examples, the passive prototype filter has included a substantially lossless resonant circuit in at least one of its series or shunt arms.

We claim:

1. An electrical filter network exhibiting a bandstop response, characterised in that the network exhibits electrical signal transfer characteristics substantially equivalent to those of a passive low pass or high pass LC ladder network including at least one negatively valued inductance or capacitive impedance element and at least one substantially lossless resonant circuit.

2. An electrical filter network as claimed in claim 1 characterised in that it exhibits electrical signal transfer characteristics substantially equivalent to those of a passive high pass LC ladder network with at least one ungrounded negative capacitance or grounded negative inductance.

3. An electrical filter network as claimed in claim 1 characterised in that it exhibits electrical signal transfer characteristics substantially equivalent to those of a passive low pass LC ladder network with at least one ungrounded negative inductance or grounded negative capacitance.

4. An electrical filter network exhibiting a bandstop response and having a low pass or high pass filter configuration, said network including:
   at least one negatively valued impedance element,
   said network exhibiting electrical signal transfer characteristics substantially equivalent to those of a passive low pass LC ladder network with at least one ungrounded negative inductance or grounded negative capacitance,
   said network being an active ladder network which is a Bruton transform of said passive LC ladder network, and including an ungrounded negative resistance in a series arm and at least one frequency-dependent negative resistance in a shunt arm.

5. An electrical filter network as claimed in claim 4 characterised in that the ungrounded negative resistance comprises two operational amplifiers, the respective output terminals of which are connected by a separate resistance element to each of the input terminals of the other amplifier, and the respective inverting input terminals of which are connected by a resistance element.

6. An electrical filter network as claimed in claim 4 or claim 5 characterised in that each frequency-dependent negative resistance in a shunt arm has an additional connection to circuit ground via a relatively large value resistance element, this resistance element acting to increase the Q-factor of the resonance of the shunt arm to which it is connected.

7. An electrical filter network as claimed in any one of claim 6 characterised in that the passive LC ladder network includes an inductance element in an output impedance termination shunt arm, this inductance element being transformed to a resistance in said active Bruton transform network.

8. An electrical filter network exhibiting a bandstop response and having a low pass or high pass filter configuration, said network including:
   at least one negatively valued impedance element,
   said network exhibiting electrical signal transfer characteristics substantially equivalent to those of a passive low pass LC ladder network with at least one ungrounded negative inductance or grounded negative capacitance,
   said passive LC ladder network being a 5th order network comprising first, second and third junction points, an input terminal, an output terminal,
   a first series arm extending between the input terminal and the first junction point and comprising, in parallel, a first resistance element and a first inductance element and a second inductance element connected between the parallel combination and the first junction point;

a second series arm extending between the first and second junction points and comprising a third inductance element, this element having a negative value;

a third series arm extending between the second and third junction points and comprising a fourth inductance element, the third junction point being connected to said output terminal;

a first shunt are connected from the first junction point to ground and comprising a fifth inductance element in series with a first capacitance element;

a second shunt arm connected from the second junction point to ground and comprising a sixth inductance element in series with a second capacitance element; and a terminating impedance arm connected from the third junction point to ground and comprising in parallel, a seventh impedance element and a second resistance element.

9. An electrical filter network exhibiting a bandstop response and having a low pass or high pass filter configuration, said network including:

at least one negatively valued impedance element, said network exhibiting electrical signal transfer characteristics substantially equivalent to those of a passive low pass LC ladder network with at least one ungrounded negative inductance or grounded negative capacitance, said passive LC network comprises first, second and third junction points, an input terminal, an output terminal, a first series arm extending between the input terminal and the first junction point and comprising in parallel a first resistance element and a first inductance element, a second series arm extending between the first and second junction points and comprising in parallel a first capacitance element and a second inductance element, a third series arm extending between the second and third junction points and comprising in parallel a second capacitance element and a third inductance element, a first shunt arm connected from the first junction point to ground and comprising a third capacitance element, a second shunt arm connected from the second junction point to ground and comprising a fourth capacitance element, this element having a negative value, and a terminating impedance arm connected from the third junction point to ground and comprising in parallel a fifth capacitance element, a fourth inductance element, and a second resistance element.

10. An electrical filter network exhibiting a bandstop response and having a low pass or high pass filter configuration, said network including:

at least one negatively valued impedance element, said network exhibiting electrical signal transfer characteristics substantially equivalent to those of a passive high pass LC ladder network with at least one ungrounded negative capacitance or grounded negative inductance, said equivalent passive LC network comprising first, second and third junction points, an input terminal, an output terminal, a first series arm extending between the input terminal and the first junction point and comprising in series a first resistance element and a first capacitance element, a second series arm extending between the first and second junction points and comprising a second capacitance element, this element having a negative value, a third series arm extending between the second and third junction points and comprising a third capacitance element, a first shunt arm connected from the first junction point to ground comprising in series a fourth capacitance element and a first inductance element, a second shunt arm connected from the second junction point to ground comprising in series a fifth capacitance element and a second inductance element, and a terminating impedance arm connected from the third junction point to ground and comprising a resistance element.

11. An electrical filter newtork exhibiting a bandstop response and having a low pass or high pass filter configuration, said network including:

at least one negatively valued impedance element, said network exhibiting electrical signal transfer characteristics substantially equivalent to those of a passive high pass LC ladder network with at least one ungrounded negative capacitance or grounded negative inductance, said equivalent passive LC ladder network compriseing first, second and third junction points, an input terminal, an output terminal, a first series arm extending between the input terminal and the first junction point and comprising a first resistance element, a second series arm extending between the first and second junction points and comprising in parallel a first inductance element and a first capacitance, a third series arm extending between the second and third junction points and comprising in parallel a second inductance element and a second capacitance element, a first shunt arm connected from the first junction point to ground and comprising a third inductance element, a second shunt arm connected from the second junction point to ground and comprising a fourth inductance element, this element having a negative value, a terminating impedance arm connected to the third junction point to ground and comprising in parallel a fifth inductance element and a second resistance element.

12. A frequency bandstop filter comprising:

an electrical component ladder network of shunt arms and series arms connected between signal input and output terminals, said arms including either inductive-valued impedance elements or capacitive-valued impedance elements so as to present a filter network configuration that is nominally a high or low frequency passing network, and wherein at least one of said series or shunt arms contains a substantially lossless resonant circuit and at least one of said series or shunt arms contains an inductive or capacitive impedance element having a negative impedance value chosen so as to result in a frequency bandstop transfer response for the overall filter network.

* * * * *